United States Patent [19]
Miller

[11] Patent Number: 6,081,427
[45] Date of Patent: Jun. 27, 2000

[54] RETAINER FOR PRESS-PACK SEMI-CONDUCTOR DEVICE

[75] Inventor: David D. Miller, Kitchener, Canada

[73] Assignee: Rockwell Technologies, LLC, Thousand Oaks, Calif.

[21] Appl. No.: 09/409,154

[22] Filed: Sep. 30, 1999

[51] Int. Cl.[7] .................................................. H05K 7/20
[52] U.S. Cl. ..................... 361/704; 361/702; 361/703; 361/707; 361/717; 361/807; 361/809; 361/820; 257/724; 257/725; 257/726; 257/727; 165/80.3; 174/16.3; 24/568; 24/569
[58] Field of Search ................................. 361/704, 690, 361/702, 703, 707, 709, 710, 717, 722, 735, 807, 808–812, 820; 257/706, 717–719, 722–727, 731, 688, 181, 909; 165/80.3, 80.1; 24/568, 569

[56] References Cited

U.S. PATENT DOCUMENTS

| | | | |
|---|---|---|---|
| 3,812,557 | 5/1974 | Meyer | 24/569 |
| 3,943,426 | 3/1976 | Thiele et al. | 257/665 |
| 4,029,141 | 6/1977 | Ferrari et al. | 165/80.4 |
| 4,224,663 | 9/1980 | Maiese et al. | 363/144 |
| 5,168,425 | 12/1992 | Radack, Jr. et al. | 361/717 |
| 5,278,434 | 1/1994 | Niwayama | 257/181 |

FOREIGN PATENT DOCUMENTS

| | | |
|---|---|---|
| 2 417 106 | 10/1975 | Germany . |
| 2 460 631 | 7/1976 | Germany . |
| 2 043 495 | 10/1975 | United Kingdom . |
| 2 046 990 | 11/1980 | United Kingdom . |

*Primary Examiner*—Leo P. Picard
*Assistant Examiner*—Boris Chervinsky
*Attorney, Agent, or Firm*—Alex Porat; John J. Horn; A. M. Gerasimow

[57] ABSTRACT

A pin-less retainer for mounting a press-pack device, which includes circumscribing fins for preventing arc formation between terminal faces thereof, onto the rods of a clamping mechanism used to stack a plurality of such devices and heat sinks together. The retainer is constructed out of a semi-flexible sheet having two mirrored sections, each section having a void therein and at least two extending tabs. The voids are sized such that the retainer may be press-fitted into interstices between the fins, and the tabs are shaped and sized to suspend the press-pack device from the rods and axially align the press-pack device with other elements of the stack. The retainer, being a pin-less mount, facilitates the easy and rapid removal of a press-pack device from a stack without having to completely disassemble it.

13 Claims, 6 Drawing Sheets

RETAINER FOR PRESS-PACK SEMI-CONDUCTOR DEVICE

FIELD OF INVENTION

The invention generally relates to retaining or mounting devices and more specifically to a device for mounting a press-pack semiconductor device onto a supporting structure such as the clamping rods of a stack.

BACKGROUND OF INVENTION

Medium to high voltage semiconductor devices such as gate turnoff thyristors (GTOs), silicon controlled rectifiers (SCRs) and insulated gate bipolar transistors (IGBTs) are used in a variety of power system applications. For example, IGBTs may be used as the switching elements in a power inverter bridge controlling a 1200 horsepower motor. These medium to high power semiconductor devices are characterized by current and voltage ratings of approximately 100 to 300 amps and 1.2 to 10 kV.

Due to the relatively high power capacities of such semiconductor devices they have to be packaged so as to contend with a number of issues, including heat dissipation, electrical contact characteristics and arcing. One common form of packaging used by the manufacturers of such devices is the "press pack". In this packaging structure the semiconductor material is enclosed in a typically cylindrically-shaped casing. The tubular body of the casing is constructed out of a non-electrically conductive material; ceramic is often used for its durability at high temperatures. The tubular body is capped with electrically conductive metallic plates which function as some (or all) of the terminals of the semiconductor device, such as the anode and cathode of a GTO or thyristor. These terminal end-faces present relatively broad planar surfaces for enabling good electrical and thermal contact with other power circuit components such as electrically conductive heat sinks. To further ensure good electrical contact and meet other operating requirements, press pack devices require a pre-specified amount of pressure to be applied thereto, typically in the range of 2–20 kN, although much higher forces are also possible.

The pressure or mounting force applied to the press-pack devices is provided by some sort of clamping mechanism. A typical clamping mechanism comprises two threaded rods fitted with plates for applying pressure provided by clamping nuts. Vice-like clamping mechanisms can also be used. These clamping mechanism are also often used to stack multiple numbers of press-pack devices and heat sinks together in abutting relationship. The resultant assembly, or "stack", can be used in a variety of power circuits such as the leg of an inverter and minimizes the number of clamping mechanisms required, which are extraneous elements of the power circuit.

In assembling the stack the conventional practice is to axially align all of the elements thereof in order to ensure uniform application of the mounting force. The way this was accomplished in the prior art is through the use of small guide pins inserted into locating holes formed on the abutting faces of the press-pack devices and heat sinks. Many press-pack devices are manufactured with small holes situated in the centre of the terminal end-faces thereof for this purpose. However, a significant problem arises with this system when it is necessary to replace one of the press-pack devices in the field. More specifically, the heat sinks of the stack are typically quasi-rigidly mounted to a supporting structure such as a housing or cabinet and therefore capable of moving apart only a few thousands of an inch to allow for thermal expansion. This distance is considerably less than the length of the guide pin as disposed in the locating hole. So, to replace one press-pack device in a large stack often meant the whole stack had to be removed from the cabinet, disassembled to replace the press-pack device, then re-assembled and re-installed. This task could require well over an hour. Alternatively, field personnel would attempt to bypass the disassembly procedure altogether by trying to pry out a press-pack device from the stack through the use of sheer force. This usually resulted in a significant scarring or gouging of the terminal end-faces of the press-pack device caused by dragging it over the embedded locating pins, and the gouges were often significant enough so as to render the press-pack devices inoperative because of a change in the thermal transfer characteristics.

SUMMARY OF INVENTION

The invention seeks to overcome various limitations of the prior art by providing a pinless retainer for mounting press-pack devices onto a supporting structure, such as, but not limited to, the clamping rods of a stack.

According to one broad aspect of the invention there is provided a retainer for mounting a press-pack device, which includes circumscribing fins for preventing arc formation between terminal faces thereof, onto a supporting structure. The retainer comprises a semi-flexible sheet having a first void therein and at least two extending tabs. The first void is sized such that the semi-flexible sheet may be press-fitted into an interstice between two of the fins so as to retain the device. The tabs are shaped to engage a designated feature of the supporting structure.

The retainer is preferably constructed out of a non-electrically conductive material, such as polypropylene. In addition, the sheet preferably includes means, such as perpendicular slots, for increasing the flexibility of the sheet at a periphery defined by the first void and reducing bending stresses thereat.

The supporting structure may be a clamping device used to assemble a stack which features two rods. In this case the tabs may be arcuate-shaped for suspending the retainer from the rods. Also, the tabs are preferably sized so as to axially align the attached press-pack device with the remaining elements of the stack. When it becomes necessary to replace a press-pack device in a stack, the few thousandths of an inch of play available in the quasi-rigidly mounted stack is sufficient to enable the press-pack device to be pulled out without having to disassemble the stack. The risk of gouging the terminal end-faces of the press-pack device is eliminated since no locating pins are employed in this system.

In the preferred embodiment, the retainer is constructed such that the sheet is comprised of first and second mirrored sections, the first section encompassing the first void, the second section having a second void and being connected to the first section by a contiguous web. The second section of the sheet may be press-fitted into another interstice between the fins of the press-pack device. This embodiment provides a more rigid structure useful for more accurate alignment of the press-pack device. Also, in use the retainer of the preferred embodiment is folded at the web thereby forming a loop which may useful in assisting field personnel to pull or yank the press-pack device from the stack in the assembled state.

BRIEF DESCRIPTION OF DRAWINGS

The foregoing and other aspects of the invention will become more apparent from the following description of specific embodiments thereof and the accompanying drawings illustrating these embodiments. In the drawings.

DETAILED DESCRIPTION OF PREFERRED EMBODIMENTS

Figure 1:
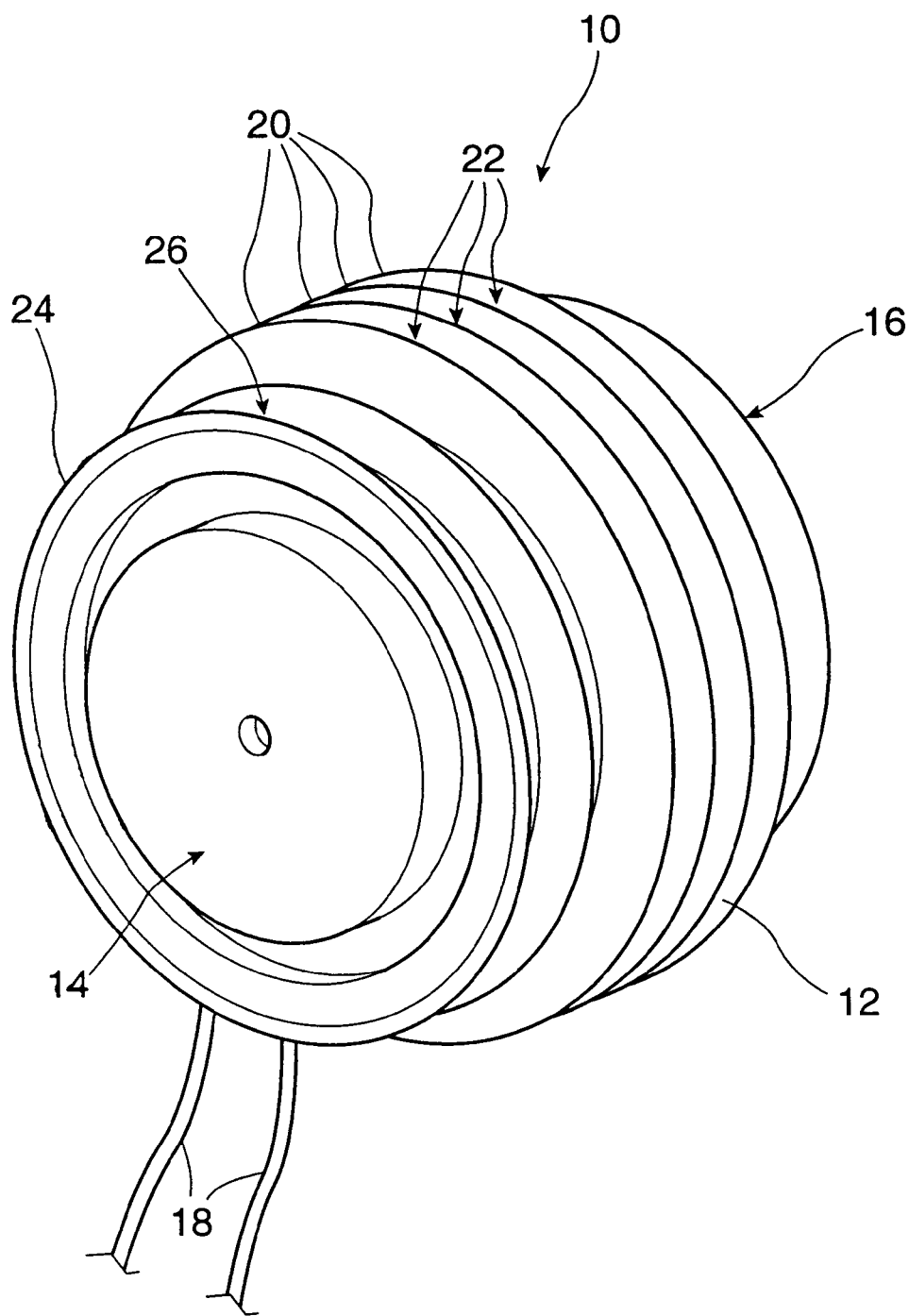
FIG. 1 is a perspective view of a typical press-pack semiconductor device.

FIG. 1 shows a typical press-pack device 10 comprising a tubular ceramic body casing 12 and electrically conductive end-faces 14, 16 which function as terminals of the device instead of the typical leads provided by other packaging structures. The press-pack device 10 may also include leads 18 which function as other terminals for the device.

Given the power handling capability of the press-pack device 10 a relatively high voltage may exist between the terminal end-faces 14, 16 resulting in the possibility of an arc forming therebetween. In order to minimize this possibility the ceramic body casing 12 features plural integrated circumscribing ceramic flanges or fins 20 extending outwardly therefrom. The fins 20 are designed to increase the linear distance between terminal end-faces 14 and 16 in order to prevent arcing across the air gap therebetween.

The fins 20 consequently define annular grooves 22 in the interstices therebetween. In addition to the ceramic fins 20, there may also exist metallic flanges or fins 24 which are used to seal the plates constituting terminal and faces 14, 16 to the casing 12. (For purposes of description the term "flange" will be used in this section of the application only to refer to this type of fin.) Flanges 24 are situated near the outer ends of the casing 12 and also define annular grooves 26 in the interstices between the fins 24 and the adjacent ceramic fins 20. Generally speaking, the height of and spacing between the fins 20 are fairly constant in any given press-pack device 10, but the height of each flange 24 may differ than that of fin 20 and the spacing between each flange 24 and the immediately adjacent fin 20 may differ from the spacing between the fins 20. For this reason, the fins 20 and associated grooves 22 are preferably employed by the preferred embodiment, as explained in greater detail below.

Figure 2:
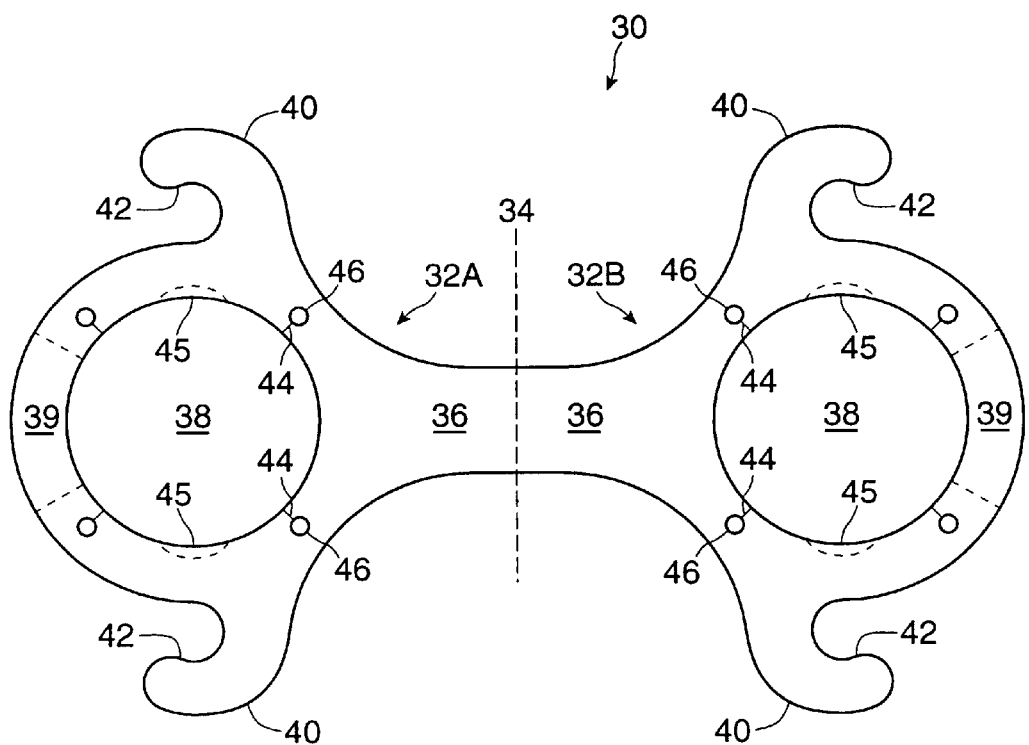
FIG. 2 is a plan view of a retainer according to a preferred embodiment for mounting the press-pack device onto the clamping mechanism of a stack.
Figure 3:
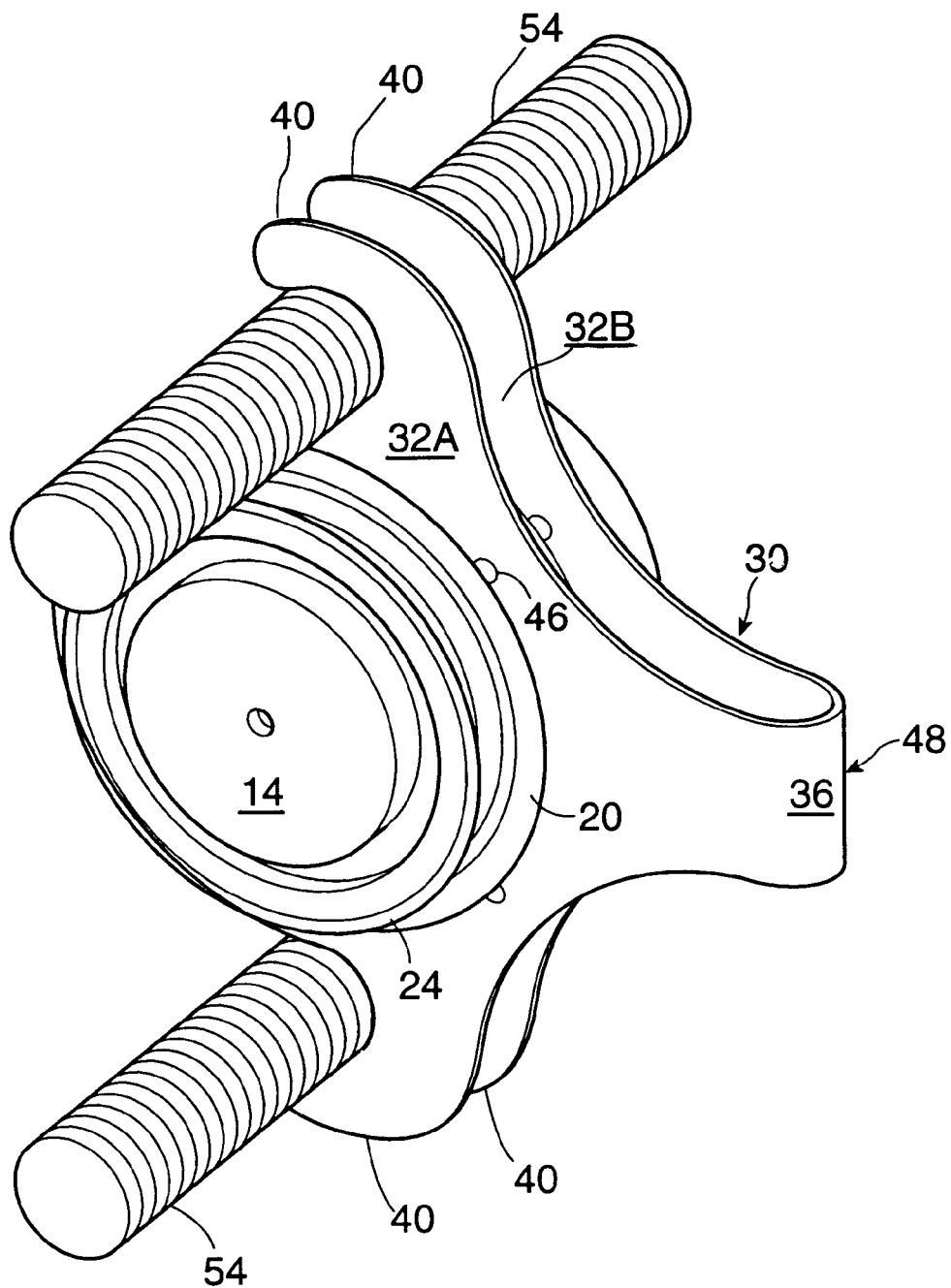
FIG. 3 is an isolated perspective view of a press-pack device mounted on the clamping rods of a stack using the preferred retainer.

FIG. 2 is a plan view of a retainer 30 according to the preferred embodiment. In this drawing, the retainer 30 is shown in its natural state prior to its application to a press-pack device 10. FIG. 3 shows the retainer 30 when applied to mount the press-pack device 10.

Referring to these drawings, the retainer 30 is preferably constructed from a semi-flexible sheet of material such as polypropylene, which is also electrically non-conductive. The retainer 30 preferably comprises two sections 32A and 32B which are mirror images of one another as taken along a centre line 34. The mirrored sections 32A and 32B are joined by a contiguous web 36. Each section 32A, 32B features a void 38. In the illustrated embodiment, each void 38 is completely encompassed by the corresponding section of the sheet, but in alternative embodiments this is not essential. For instance, a portion 39 of the sheet shown in stippled lines may be removed such that the sheet features a pincer-like shape at its outer end. In any event, each void is sized so that the semi-flexible sheet constituting the retainer 30 may be press fitted over the fins 20 of press pack device 10 (as shown in FIG. 3).

Slits 44 are cut perpendicularly into the sheet at the arcuate peripheries defined by the voids 38 in order to increase the flexibility of the sheet thereat. The slits 44 coalesce into holes 46. The holes 46 are provided to relieve the bending stresses at these points of the sheet. Gaps 45 (shown in stippled lines) may be used in the alternative for the purpose of increasing the flexibility of the sheet at the peripheries defined by voids 38 while reducing the stress thereat.

The retainer 30 includes extending tabs 40 which are shaped to engage a designated feature of the structure upon which the press pack device 10 is mounted. In the preferred embodiment, this structure includes cylindrical rods and thus the tabs 40 feature arcuate shaped peripheries 42 designed to hang or suspend the retainer 30 therefrom.

FIG. 3 shows the retainer 30 applied to a press pack device 10 and mounted to rods 54. When applied, the retainer 30 is folded at or near its centre line 34 so that web 36 forms a loop 48. One section 32A of the sheet is preferably fitted into one of the grooves 32 and the other section 32B is fitted into another groove 22. Grooves 26 may alternatively be used in appropriate circumstances. For the purposes of snugly retaining the press pack device 10, the voids 38 of the retainer 30 are preferably sized to have breadths smaller than the diameters of fins 20 or flanges 24. In the most preferred embodiment, the voids 38 are sized substantially equal to the diameter of casing 12 defined at grooves 22 or 26 for the snuggest possible fit.

Figure 4:
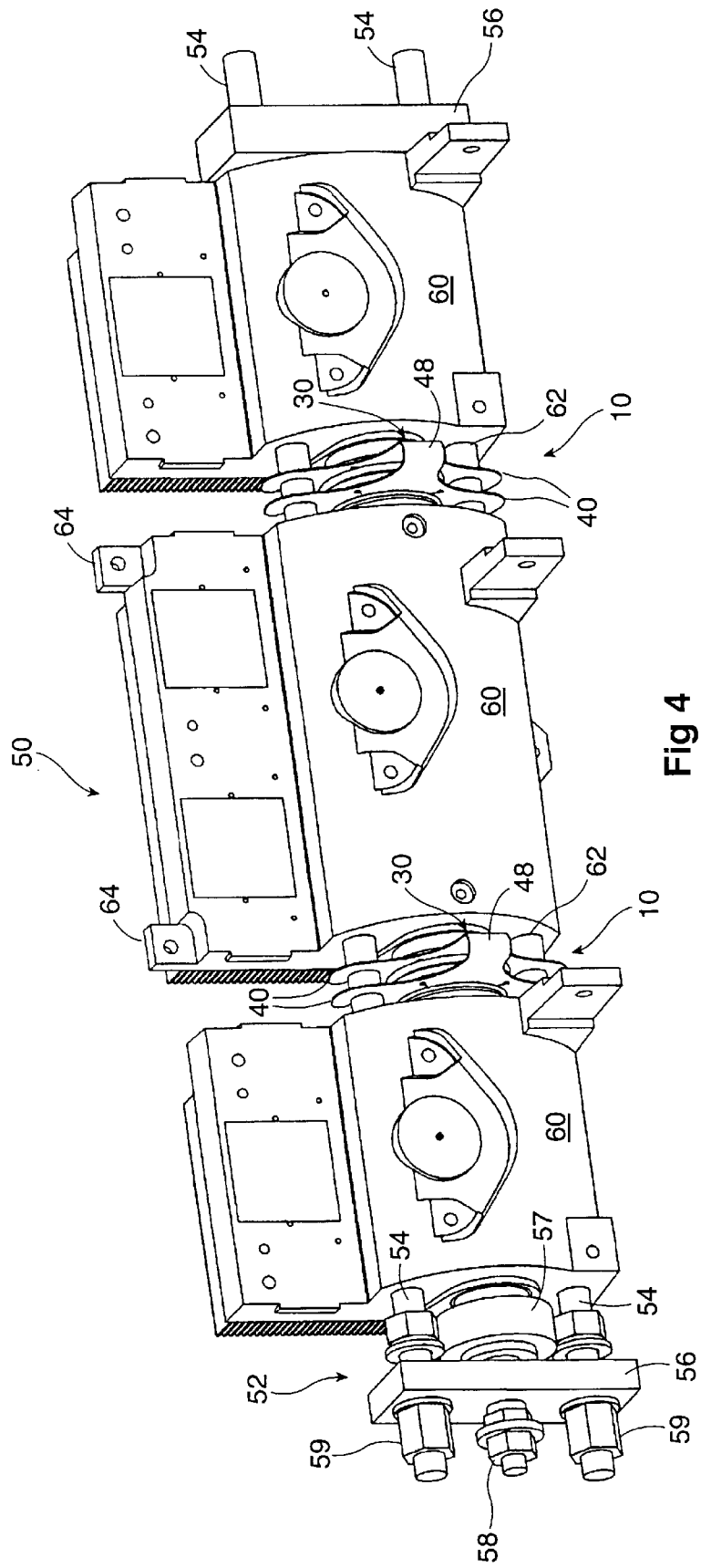
FIG. 4 is a perspective view of an assembled stack having a number of press pack devices mounted therein using the preferred retainer.
Figure 5:
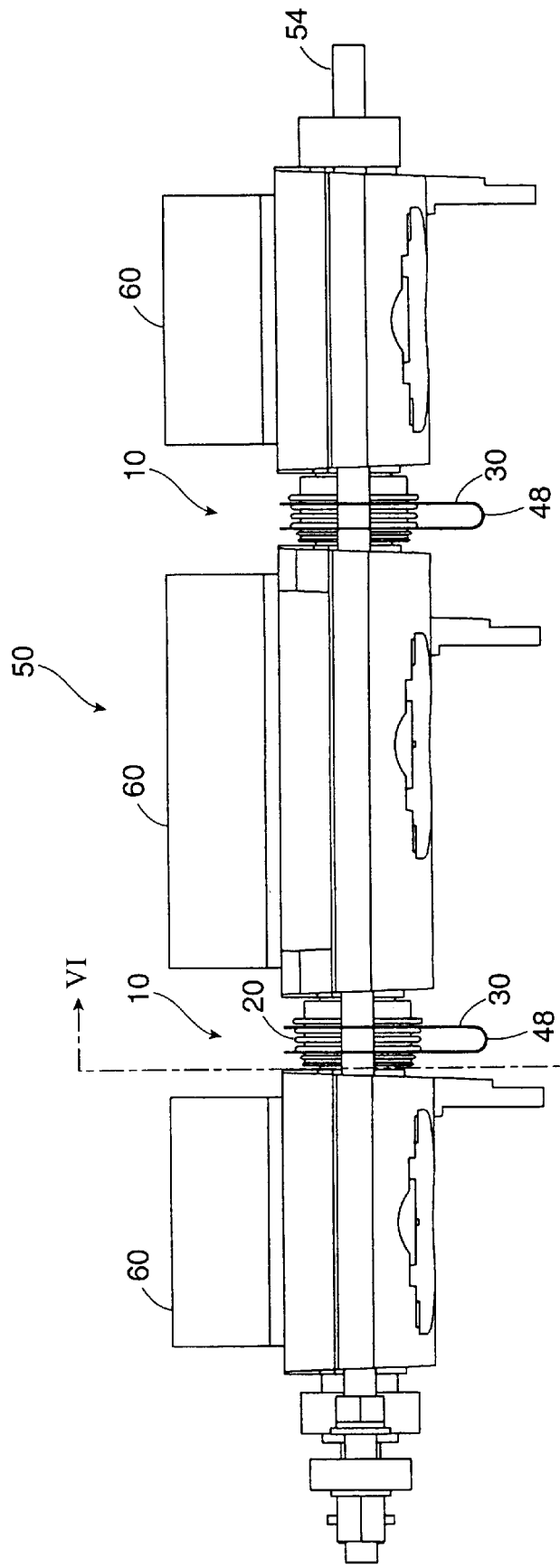
FIG. 5 is a top view of the stack shown in FIG. 4.
Figure 6:
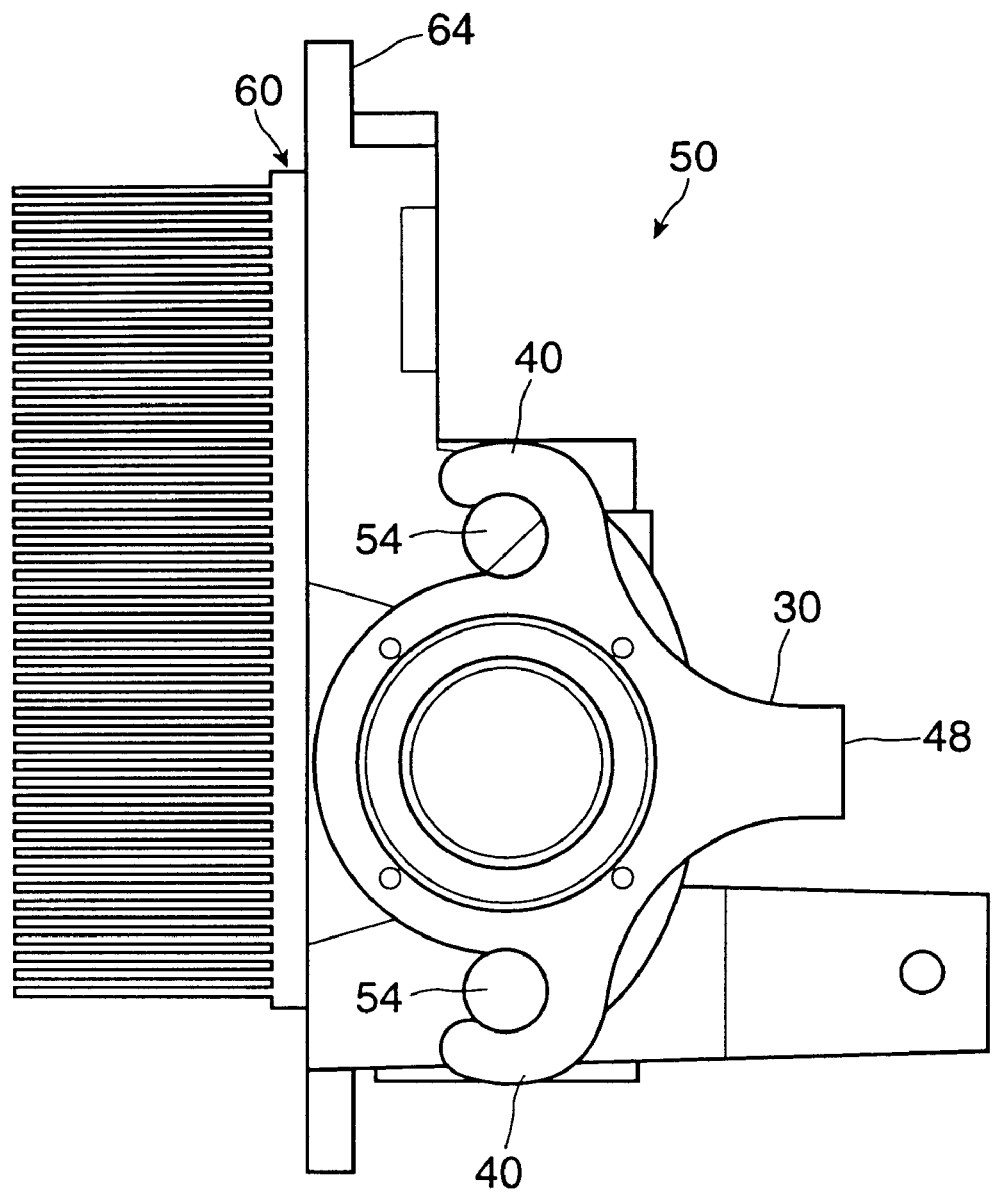
FIG. 6 is a cross-sectional view of the stack shown in FIGS. 4 & 5 taken along line VI—VI therein.

FIGS. 4, 5 and 6 show perspective, top and cross-sectional views of an assembled stack 50 having a number of press pack devices 10 as elements thereof. The other power circuit elements of the stack 50 are electrically conductive heat dissipating conduits or heat sinks 60. In this example the press pack devices are flush mounted to the heat sinks 60 such that the terminal end-faces 14, 16 of each press pack device 10 abuts the adjacent current-conducting heat sink 60. Mechanically, the stack 50 includes a clamping mechanism 52 comprising rods 54, plates 56, thrust bearing element 57, tensioning nut 58 assembly nuts 59. The plates 56, rods 54 and assembly nuts 59 maintain the element of the stack in an assembled state. The tensioning nut 58 is used in conjunction with the thrust bearing element 57 for compressing the elements of the stack including the press-pack devices 10 to a prespecified pressure as per manufacturer's requirements. As mentioned previously, in order to ensure uniform application of this mounting force onto the stack elements, they are axially aligned. The alignment means for the heat sinks 60 is provide by bores 62 which accept the clamp rods 54. The alignment means for the press pack device 10 include the tabs 40 of retainer 30. The retainer and its tabs are specifically sized for this purpose.

In practice, the stack 50 is quasi-rigidly mounted to the wall of a housing or cabinet (not shown) for which purpose mounts 64 are provided. When the stack 50 is mounted in its assembled state, the elements thereof are capable of moving apart, i.e., have a play of, only a few thousandths of an inch, sufficient to permit thermal expansion of the heat sinks 60. This may be provided by using bolts which are sized a few thousandths of an inch smaller than the holes of mounts 64.

However, through the use of the pinless retainer 30, replacing one or more of the press pack devices 10 is a relatively quick procedure that does not require disassembly of the stack 50. Instead, service personnel need only loosen the tensioning nut 58 to relieve the pressure or mounting force on the stack elements. The nuts 59 of the clamping mechanism 52, do not have to be removed thereby enabling the stack 50 to remain in an assembled state. Once the tensioning nut 58 is loosened, the few thousandths of an inch of play available in the stack is sufficient to allow the desired press-pack device 10 to be pulled out of the stack 50. Since there are no pins the problem of scarring or gouging the surface of the terminals 14, 16 is avoided. The press-pack device 30 may be pulled out of the stack by grasping the loop 48 of the retainer 30 using one's finger. This extra leverage can be quite useful particularly since in practice electrical joint compound is applied between the abutting faces of the press pack devices 10 and heat sinks 60 and this compound tends to become quite tacky over time. Note also that while one press pack device 10 is removed from the stack, the other press pack devices may remain in an axially aligned state as provided by retainer 30.

To reinsert the press pack device 10, the retainer 30 is applied to it as previously described. The press pack device 10 with applied retainer may thereafter be pushed back into place in the stack. Once in place, the extending tabs 40 of retainer 30 are employed to suspend the press pack device 10 from the clamp rods 54 in order to align the just-inserted device with the remaining elements of the stack. The tensioning nut 58 may then be set desired mounting force.

It should be appreciated that the extending tabs 40 of the preferred embodiment have been shaped to engage an arcuate supporting structure, namely the clamping rods 54. However, these tabs may be shaped in a variety of alternative patterns in order to engage predefined features of other types of supporting structures. For instance, the tabs may be right-angled so as to engage slots cut into a solid supporting structure.

It should also be appreciated that while the retainer according to the preferred embodiment is constructed out of two identical sections an alternative embodiment may employ only one of these sections. The preferred embodiment, however, is more advantageous over this alternative because the two mirrored sections provide a more rigid and stable structure which is capable of axially aligning the press pack device 10 in the stack using the clamping rods 54. The preferred embodiment also provides the loop 48 which is quite handy for yanking out the press pack device 10.

Similarly, those skilled in the art will understand that numerous variations and modifications may be made to the embodiments described herein without departing from the spirit and scope of the invention.

What is claimed is:

1. A retainer for mounting a press-pack device onto a supporting structure, wherein the press-pack device includes circumscribing fins for preventing arc formation between terminal faces thereof, the retainer comprising a semi-flexible sheet having a first void therein and at least two extending tabs, the first void being sized such that the semi-flexible sheet may be press-fitted into an interstice between two of the fins so as to retain the device, the tabs being shaped to engage a designated feature of the supporting structure.

2. The retainer according to claim 1, wherein the first void has a breadth smaller than said fins in order to securely retain the press-pack device.

3. The retainer according to claim 1, wherein the first void has a breadth sized to accommodate the press-pack device at a cross-section thereof defined at the interstice between said fins.

4. The retainer according to claim 1, wherein the supporting structure is a clamping device having two rods, and the tabs are arcuate-shaped for suspending the retainer from the rods.

5. The retainer according to claim 1, wherein the sheet comprises first and second mirrored sections, the first section encompassing the first void, the second section having a second void and being connected to the first section by a contiguous web so as to enable the sheet to be folded thereat in order to form a loop.

6. The retainer according to claim 5, wherein the supporting structure is a clamping device having two rods, and the tabs are arcuate-shaped for suspending the retainer from the rods.

7. The retainer according to claim 1, wherein the sheet is constructed out of a non-electrically conductive material.

8. The retainer according to claim 7, wherein the sheet is made out of polypropylene.

9. The retainer according to claim 1, wherein the sheet comprises means for increasing the flexibility of the sheet at a periphery defined by the first void and reducing bending stresses thereat.

10. An assembly of press-pack devices and heat sinks comprising:
    a clamping mechanism supporting said press-pack devices and said heat sinks together, wherein the clamping mechanism includes at least two rods; and
    retainers mounting said press-pack devices onto said rods, wherein each said press-pack device includes circumscribing fins for preventing arc formation between terminal faces thereof, and each said retainer comprises a semi-flexible sheet having a first void therein and at least two extending tabs, said sheet being press-fitted at said first void into an interstice between two of said fins so as to retain once of said press-pack devices, said tabs being arcuate-shaped to engage said rods and suspend said press-pack device therefrom.

11. The assembly according to claim 10, wherein said tabs are sized and positioned so as to axially align said press-pack devices in said clamping mechanism.

12. The assembly according to claim 11, wherein said sheet comprises first and second mirrored sections, said first section encompassing said first void, said second section having a second void and being connected to said first section by a contiguous web so as to enable said sheet to be folded thereat in order to form a loop.

13. The assembly according to claim 12, wherein said sheet comprises means for increasing the flexibility of said sheet at peripheries defined by said first and second voids and reducing bending stresses thereat.

* * * * *